US009276231B2

(12) United States Patent  (10) Patent No.: US 9,276,231 B2
Segawa et al.  (45) Date of Patent: Mar. 1, 2016

(54) METHOD FOR FABRICATING ORGANIC ELECTROLUMINESCENCE DEVICE AND ORGANIC ELECTROLUMINESCENCE DEVICE

(75) Inventors: Yasuo Segawa, Hyogo (JP); Tomomi Hiraoka, Hyogo (JP)

(73) Assignee: JOLED INC., Tokyo (JP)

( * ) Notice: Subject to any disclaimer, the term of this patent is extended or adjusted under 35 U.S.C. 154(b) by 57 days.

(21) Appl. No.: 13/984,641

(22) PCT Filed: Jun. 16, 2011

(86) PCT No.: PCT/JP2011/003443
§ 371 (c)(1),
(2), (4) Date: Aug. 9, 2013

(87) PCT Pub. No.: WO2012/172612
PCT Pub. Date: Dec. 20, 2012

(65) Prior Publication Data
US 2013/0320323 A1   Dec. 5, 2013

(51) Int. Cl.
*H01L 29/08* (2006.01)
*H01L 35/24* (2006.01)
*H01L 51/00* (2006.01)
*H01L 51/52* (2006.01)

(52) U.S. Cl.
CPC ........ *H01L 51/5209* (2013.01); *H01L 51/0023* (2013.01); *H01L 51/5225* (2013.01); *H01L 2251/568* (2013.01)

(58) Field of Classification Search
CPC ..................................................... H01L 33/00
USPC ..................................... 257/40; 438/4, 61, 79
See application file for complete search history.

(56) References Cited

U.S. PATENT DOCUMENTS

| 6,605,372 B1 * | 8/2003 | Kubota .......................... 428/690 |
| 6,909,111 B2 | 6/2005 | Yamagata et al. |
| 7,234,984 B2 | 6/2007 | Nishikawa et al. |
| 7,258,586 B2 | 8/2007 | Tamura et al. |

(Continued)

FOREIGN PATENT DOCUMENTS

| CN | 101183079 | 5/2008 |
| CN | 101213687 | 7/2008 |

(Continued)

OTHER PUBLICATIONS

U.S. Appl. No. 14/005,687 to Tomomi Hiraoka et al., filed Sep. 17, 2013.

(Continued)

*Primary Examiner* — Kevin Parendo
*Assistant Examiner* — Ismail Muse
(74) *Attorney, Agent, or Firm* — Greenblum & Bernstein, P.L.C.

(57) ABSTRACT

A method for fabricating an organic electroluminescence device according to the present invention includes: preparing an organic electroluminescence device having a lower electrode, an organic layer including an emitting layer, an upper electrode, and a shorted part in which the lower electrode and the upper electrode are shorted; and irradiating a part surrounding the shorted part in which the lower electrode and the upper electrode are shorted to alter a material composing the lower electrode or the upper electrode and to form a space between the lower electrode and the upper electrode in a region corresponding to a region surrounded by an altered part.

18 Claims, 14 Drawing Sheets

(56) References Cited

U.S. PATENT DOCUMENTS

| | | | |
|---|---|---|---|
| 7,611,745 | B2 | 11/2009 | Nishikawa et al. |
| 7,701,133 | B2 | 4/2010 | Kajiyama et al. |
| 7,871,930 | B2 | 1/2011 | Yamagata et al. |
| 8,148,896 | B2 | 4/2012 | Kajiyama et al. |
| 8,273,583 | B2 | 9/2012 | Yamagata et al. |
| 8,367,439 | B2 | 2/2013 | Yamagata et al. |
| 8,518,719 | B2 | 8/2013 | Hiraoka et al. |
| 2002/0142697 | A1* | 10/2002 | Yamagata et al. ............. 445/24 |
| 2003/0222861 | A1 | 12/2003 | Nishikawa et al. |
| 2004/0202777 | A1 | 10/2004 | Nishikawa et al. |
| 2005/0196892 | A1 | 9/2005 | Yamagata et al. |
| 2005/0215163 | A1 | 9/2005 | Tamura et al. |
| 2006/0214575 | A1 | 9/2006 | Kajiyama et al. |
| 2008/0055211 | A1 | 3/2008 | Ogawa |
| 2010/0062550 | A1* | 3/2010 | Buchel et al. .................. 438/17 |
| 2010/0164375 | A1 | 7/2010 | Kajiyama et al. |
| 2010/0233931 | A1 | 9/2010 | Yamagata et al. |
| 2011/0136266 | A1 | 6/2011 | Yamagata et al. |
| 2013/0248844 | A1 | 9/2013 | Hiraoka |

FOREIGN PATENT DOCUMENTS

| | | | |
|---|---|---|---|
| JP | 2000-331782 | | 11/2000 |
| JP | 2002-260857 | | 9/2002 |
| JP | 2004-227852 | | 8/2004 |
| JP | 2005-276600 | | 10/2005 |
| JP | 2006-269108 | | 10/2006 |
| JP | 2009010427 | * | 1/2009 |
| JP | 2009-266917 | | 11/2009 |
| JP | 2011-077124 | | 4/2011 |
| WO | 2007/004118 | | 1/2007 |

OTHER PUBLICATIONS

International Search Report and Written Opinion of International Searching Authority, dated Aug. 2, 2011, along with an English translation of ISR.
Written Opinion of International Preliminary Examining Authority, dated Dec. 11, 2012.
International Preliminary Report on Patentability, dated Apr. 2, 2013.
China Office Action (including Search Report) in China Patent Application No. 201180067632.4, mail date is Jun. 16, 2015, together with an English language translation of the Search Report.

* cited by examiner

METHOD FOR FABRICATING ORGANIC ELECTROLUMINESCENCE DEVICE AND ORGANIC ELECTROLUMINESCENCE DEVICE

TECHNICAL FIELD

The present invention relates to a method for fabricating an organic electroluminescence (hereafter referred to as "organic EL") device using electroluminescence (EL), and particularly relates to a method for recovering from a dark spot defect in the organic EL device.

BACKGROUND ART

Conventionally, in an organic EL device having an organic layer formed between an upper electrode which is a cathode and a lower electrode which is an anode, there is a case in which the organic EL device is defective due to a short between the upper electrode and the lower electrode when a conductive foreign material is attached or entered during the fabrication process.

In this case, there is a known technique for repairing defect caused by the short by irradiating the shorted part with a laser beam (for example, see the patent literatures 1 and 2).

The repairing method disclosed in the patent literature 1 includes detecting the conductive foreign material attached to the organic EL device and irradiating the organic layer in a region around the foreign material with the laser. According to this method, a high resistance area may be formed between the upper electrode and the lower electrode of the organic EL device to which the foreign material is attached and the shorted defect between the upper electrode and the lower electrode are recovered from the shorted defect in between, without irradiating the foreign material with the laser directly.

Furthermore, the repair method disclosed in the patent literature 2 includes forming, in an organic EL device including a transparent electrode, organic material layers, and a metal electrode sequentially stacked on a transparent substrate, a layer contacting the transparent electrode among organic material layers as a leakage prevention layer which evaporates by absorbing a laser beam. With this configuration, by irradiating the leaking part with the laser beam, the leakage prevention function layer is expanded and evaporated. As a result, a space is formed inside, and the space separates the metal electrode and the transparent electrode so as to solve the leakage.

CITATION LIST

Patent Literature

[Patent Literature 1] Japanese Unexamined Patent Application Publication No. 2004-227852
[Patent Literature 2] Japanese Unexamined Patent Application Publication No. 2000-331782

SUMMARY OF INVENTION

Technical Problem

The repair method disclosed in the patent literature 1 is a method for recovering from the short-circuit defect by increasing the resistance in the organic layer around the foreign material by the laser irradiation. This method is effective when the size of the foreign material is smaller than the thickness of the organic layer. However, there is a problem in the repair method disclosed in the patent literature 1 that recovery from the short-circuit defect between the upper electrode and the lower electrode is difficult if the size of the foreign material is larger than the thickness of the organic layer.

Furthermore, as in the repair method disclosed in the patent literature 2, if there is only a space caused by the evaporation of the organic material layer as the leakage prevention functional layer, it would cause a defect again by a re-short between the upper electrode and the lower electrode.

The present invention has been conceived in view of the problem described above, and it is an object of the present invention to provide a method for fabricating an organic EL device and an organic EL device capable of securely recovering from the short-circuit defect between the upper electrode and the lower electrode.

Solution to Problem

In order to solve the problem described above, an aspect of the method for fabricating the organic EL device according to the present invention includes preparing an organic electroluminescence device having a lower electrode, an organic layer including an emitting layer, an upper electrode, and a shorted part in which the lower electrode and the upper electrode are shorted; and irradiating a part surrounding the shorted part in which the lower electrode and the upper electrode are shorted with an ultrashort laser to alter a material composing the lower electrode or the upper electrode such that an altered part is formed and to form a space, different from the altered part, between the lower electrode and the upper electrode in a region corresponding to a region surrounded by an altered part.

Advantageous Effects of Invention

According to the method for fabricating the organic EL device according to the present invention, the short-circuit defect between the upper electrode and the lower electrode can be recovered from the short-circuit defect in between.

DESCRIPTION OF EMBODIMENTS

Figure 1:
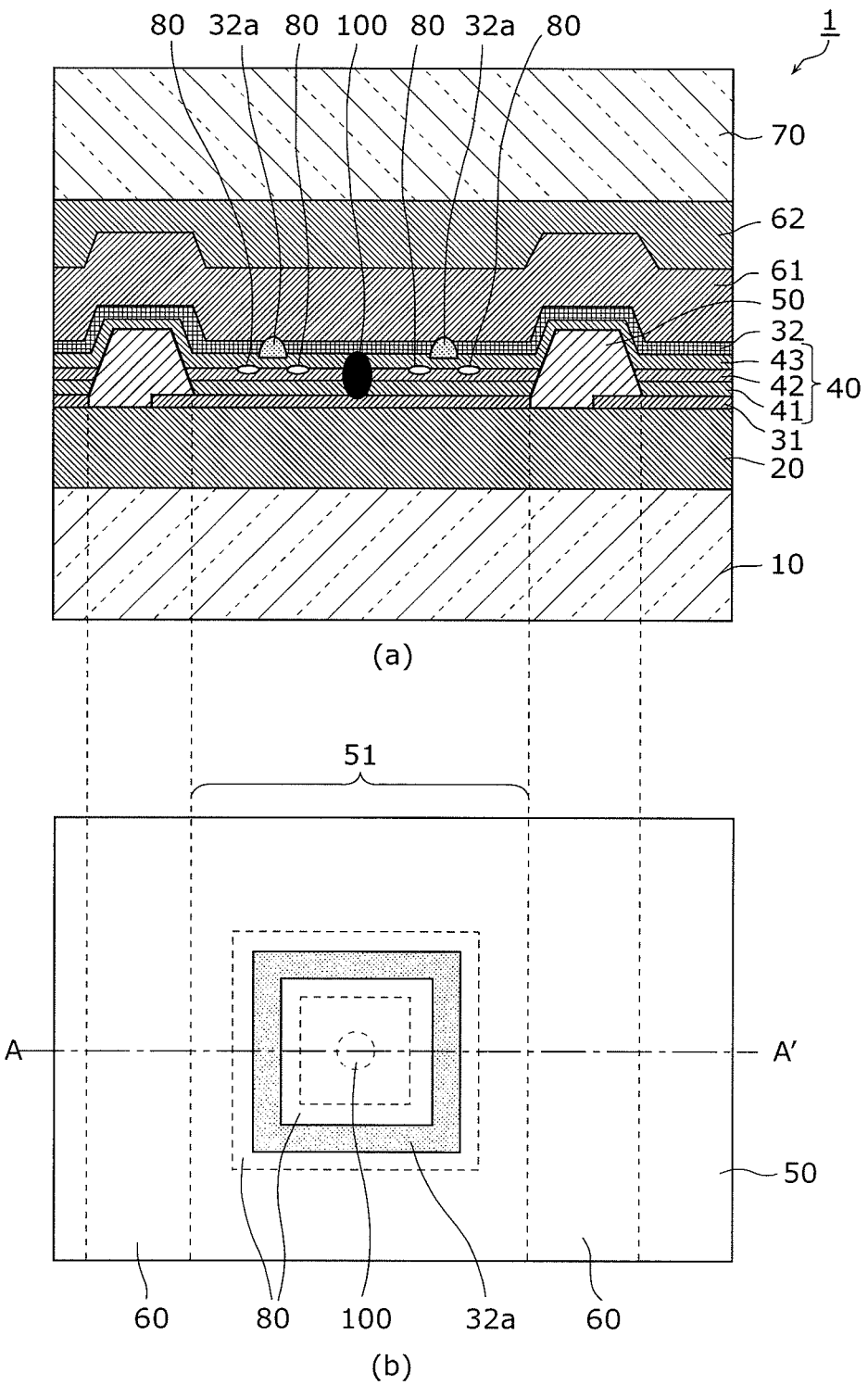
FIG. 1 is a cross-sectional view and a plan view illustrating a configuration of a pixel when an organic EL device according to the embodiment 1 is applied to an organic EL display apparatus.

An aspect of the method for fabricating the organic EL device according to the present invention includes preparing an organic electroluminescence device having a lower electrode, an organic layer including an emitting layer, an upper electrode, and a shorted part in which the lower electrode and the upper electrode are shorted; and irradiating a part surrounding the shorted part in which the lower electrode and the upper electrode are shorted with a laser to alter a material composing the lower electrode or the upper electrode and to form a space between the lower electrode and the upper electrode in a region corresponding to a region surrounded by an altered part.

According to this aspect, the altered part is formed by altering the part of the upper electrode or the lower electrode and the space is formed between the lower electrode and the upper electrode by the laser irradiation. With this, a high resistance region including the altered part and the space is formed in the region surrounded by the shorted part. When applying voltage between the lower electrode and the upper electrode, more current flows in a region not surrounded by the altered part than the light-emitting region surrounded by the altered part. Accordingly, the short caused by the shorted part can be solved.

Note that, in this Specification, the short not only includes a state in which the lower electrode and the upper electrode are completely conducted, but also a state in which the resistance between the lower electrode and the upper electrode is small and the current is likely to flow.

In an aspect of the method for fabricating the organic EL device according to the present invention, when preparing the organic electroluminescence device, a material composing at least one of the lower electrode and the upper electrode in the organic electroluminescence device is preferably a transparent metal oxide.

According to this aspect, by using a femtosecond laser as the laser, it is possible to change the structure of the transparent metal oxide easily so as to increase the resistance.

In an aspect of the method for fabricating the organic EL device according to the present invention, when irradiating the shorted part with the laser, the transparent metal oxide is preferably altered to have a granular structure and a higher resistance value.

In an aspect of the method for fabricating the organic EL device according to the present invention, when preparing the organic electroluminescence device, the organic electroluminescence device including the organic layer having an electron transport layer adjacent to the emitting layer may be prepared, and when irradiating the shorted part with the laser, the space may be formed between the emitting layer and the electron transport layer. Alternatively, in an aspect of the method for fabricating the organic EL device according to the present invention, when preparing the organic electroluminescence device, an organic electroluminescence device including the organic layer having an electron transport layer adjacent to the upper electrode may be prepared, and when irradiating the shorted part with the laser, the space may be formed between the upper electrode and the electron transport layer.

In an aspect of the method for fabricating the organic EL device according to the present invention, when preparing the organic electroluminescence device, an electroluminescence device including a conductive foreign material in the organic layer at the shorted part may be prepared.

According to this aspect, the short due to the conductive foreign material may be fixed.

In an aspect of the method for fabricating the organic EL device according to the present invention, when irradiating the shorted part with the laser, the space is preferably formed between the conductive foreign material and the upper electrode.

According to this aspect, the conductive foreign material does not contact the upper electrode due to the space, and thus the current path through the conductive foreign material can be blocked. With this, the short-circuit defect can be completely solved. In particular, a resistance value by the space close to the infinity is added to a finite resistance value by the altered space. Accordingly, even if the resistance value increases along with the increase in the resistance value of the organic layer and the chronological change in the organic layer when displaying a low tone image, the EL current in the repaired pixel can be secured, securing sufficient luminance.

Furthermore, the space is formed at a part near the part irradiated with the laser. Accordingly, the configuration of this aspect can be implemented by simply reducing the region irradiated with the laser. With this, the repair region can be reduced to make the repair trace visually unrecognizable, achieving high-quality display even after the repair. Furthermore, the product life of the organic layer in the repaired pixel can be increased by reducing the repaired region.

In an aspect of the method for fabricating the organic EL device according to the present invention, the laser is preferably an ultrashort pulse laser. Here, a pulse width of the ultrashort pulse laser is preferably 100 fs to 20 ps. Furthermore, a wavelength of the laser is preferably 900 to 2500 nm.

According to this aspect, the time for irradiating the organic layer with the ultrashort pulse laser can be reduced. Accordingly, it is possible to increase the resistance in the shorted part while reducing the damage on the organic layer.

In an aspect of the method for fabricating the organic EL device according to the present invention, when preparing the organic electroluminescence device, an organic electroluminescence device in which a protective layer is formed above the upper electrode may be prepared, and when irradiating the shorted part with the laser, the laser irradiation may be performed through the protective layer. Furthermore, when preparing the organic electroluminescence device, an organic electroluminescence device having a light-adjusting layer formed above the protective layer may be prepared, and when irradiating the shorted part with the laser, the laser irradiation may be performed through the protective layer and the light-adjusting layer.

According to this aspect, even the organic EL device in which the protective layer is formed, the short-circuit defect can be easily fixed.

An aspect of the organic EL device according to the present invention includes: a lower electrode; an organic layer including an emitting layer; and an upper electrode, wherein the organic electroluminescence device further includes: an altered part in which a material composing the lower electrode or the upper electrode is altered by laser irradiation; and a space defined by the organic layer corresponding to a region surrounded by the altered part.

According to this aspect, the high resistance region is formed by the part where the part of the upper electrode or the lower electrode is altered by the laser irradiation and the space surrounded by the altered part. With this, when applying voltage between the lower electrode and the upper electrode, more current flows in a region not surrounded by the altered part than the light-emitting region surrounded by the altered part. Accordingly, the short caused by the shorted part can be solved.

In an aspect of the method for fabricating the organic EL device according to the present invention, a material composing at least one of the lower electrode and the upper electrode in the organic electroluminescence device is preferably a transparent metal oxide.

According to this aspect, by using a femtosecond laser as the laser, it is possible to change the structure of the transparent metal oxide easily so as to increase the resistance.

In an aspect of the method for fabricating the organic EL device according to the present invention, in the altered part, the transparent metal oxide is preferably altered to have a granular structure and a higher resistance value. Here, a sheet resistance value of the altered part is preferably at least 1 $M\Omega/\square$.

According to this aspect, the resistance value at the part altered by the laser irradiation can be set higher than the resistance value of the part not irradiated with the laser, solving the short-circuit defect.

In an aspect of the method for fabricating the organic EL device according to the present invention, the organic layer may include an electron transport layer adjacent to the emitting layer, and the space may be formed between the emitting layer and the electron transport layer. In an aspect of the organic EL device according to the present invention, the organic layer may include an electron transport layer adjacent to the upper electrode, and the space may be formed between the upper electrode and the electron transport layer.

In an aspect of the method for fabricating the organic EL device according to the present invention, a conductive foreign material is preferably included in the organic layer corresponding to a region surrounded by the altered part.

According to this aspect, the short due to the conductive foreign material may be solved.

In an aspect of the method for fabricating the organic EL device according to the present invention, the space is preferably formed between the conductive foreign material and the upper electrode.

According to this aspect, the conductive foreign material does not contact the upper electrode due to the space, and thus the current path through the conductive foreign material can be blocked. With this, the short-circuit defect can be completely solved. In particular, a resistance value by the space close to the infinity is added to a finite resistance value by the altered space. Accordingly, even if the resistance value increases along with the increase in the resistance value of the organic layer and the chronological change in the organic layer when displaying a low-tone image, the EL current in the repaired pixel can be secured, securing sufficient luminance.

Furthermore, the space is formed at a part near the part irradiated with the laser. Accordingly, the configuration of this aspect can be implemented by simply reducing the region irradiated with the laser. With this, the repair region can be reduced to make the repair trace visually unrecognizable, achieving high-quality display even after the repair. Furthermore, the product life of the organic layer in the repaired pixel can be increased by reducing the repaired region.

The method for fabricating the organic EL device and the organic EL device according to the embodiments of the present invention shall be described as follows with reference to the drawings. Note that, in the following description, identical or equivalent components are assigned with the same numerals through the drawings, and the overlapping description shall be omitted.

Embodiment 1

First, an organic EL device 1 according to the embodiment 1 shall be described with reference to FIG. 1. FIG. 1 illustrates a configuration of one pixel when the organic EL device according to the embodiment 1 is applied to an organic EL display apparatus, and FIG. 1(a) is a cross-sectional view of an organic EL device according to the embodiment 1. FIG. 1(b) is a plan view of the organic EL device. Note that, FIG. 1(a) is a cross-sectional view along the line A-A' in FIG. 1(b).

The organic EL device 1 according to the embodiment 1 is an organic functional device including an organic layer disposed between an anode and the cathode, and includes a substrate 10, a planarizing layer 20 formed on the substrate 10, a bank 50 formed on the planarizing layer 20, and the following components sequentially formed on the planarizing layer 20: a lower electrode 31, a hole injection layer (HIL) 41, an emitting layer (EML) 42, an electron transport layer (ETL) 43, an upper electrode 32, a thin-film sealing layer 61, a sealing resin layer 62, and light-transmitting substrate 70, as illustrated in FIG. 1(a).

In the embodiment 1, the HIL 41, the EML 42, and the ETL 43 are layers composing the organic layer 40. The organic layer 40 includes the EML 42, and is formed between the lower electrode 31 and the upper electrode 32. The thickness of the organic layer 40 is 100 to 200 nm, for example. Note that the organic layer 40 may include a hole transport layer (HTL) and an electron injection layer (EIL), in addition to the HIL 41, the EML 42, and the ETL 43. In this case, polyphenylene vinylene (PPV) may be used for the EIL, and triphenylamine or polyaniline may be used for the HTL.

A transparent substrate may be used for the substrate 10, and the substrate 10 is a transparent glass substrate made of transparent alkali-free glass having the thickness of 0.5 mm, for example. Furthermore, as the substrate 10, a flexible substrate made of resin may be used. Note that, the substrate 10 may not have to be transparent, and an opaque substrate such as a silicon substrate may be used for the top-emission organic EL device 1 as in the embodiment 1.

The planarizing layer 20 includes a driving circuit including a circuit element such as a transistor and a planarizing film for planarizing the driving circuit. The driving circuit includes a switching transistor for selecting a pixel in an organic EL display apparatus, a thin-film transistor such as a driving transistor for controlling light emission of the EML in each pixel, lines such as a power supply line and a video signal line, or others. An insulating organic material may be used as the planarizing film, for example. Thin-film transistors (TFT) are formed in the planarizing layer 20 in the organic EL display apparatus, and the substrate 10 on which the planarizing layer 20 is formed serves as an active-matrix TFT array substrate.

The lower electrode 31 is an anode where holes are supplied, that is, current flows from the driving circuit part, and is formed on the planarizing layer 20. Since the organic EL device 1 according to the embodiment 1 is of top-emission type, the lower electrode 31 serves as a reflective electrode. The lower electrode 31 as the reflective electrode may be a single-layer structure of a reflective metal such as Al or silver alloy APC, or a two-layered structure of a transparent metal oxide and a the reflective metal. For example, the transparent metal oxide is indium tin oxide (ITO), and the reflective metal is the silver alloy APC. The thickness of the lower electrode 31 may be 10 to 40 nm, for example. Note that, the lower electrode 31 in the embodiment 1 is separately formed for each light-emitting region 51. If the organic EL display apparatus is a bottom-emission organic EL display apparatus, the lower electrode 31 may be a transparent electrode made of transparent metal oxide such as ITO.

The HIL 41 is formed on the lower electrode 31, and is capable of stably injecting holes into the EML 42. The HIL 41 also supports generation of the holes. By forming the HIL 41, the driving voltage can be reduced, and the product life of the device can be increased. The HIL 41 may be formed using a predetermined organic material having a material hole injecting property as a main component. For example, a compound such as poly(3,4-ethylenedioxythiophene) (PEDOT) or aniline may be used. Note that, the HIL 41 is separately formed for each light-emitting region 51.

The EML 42 is formed on the HIL 41. The light-emitting material in the EML 42 emits light when excited by energy generated by recombination of electrons and holes injected by application of a predetermined voltage to the lower electrode 31 and the upper electrode 32. The EML 42 is an organic light-emitting layer composed of an organic material having predetermined electroluminescence for each light-emitting region 51, and has a stacked structure including a lower layer, α-NPD(Bis[N-(1-naphthyl)-N-phenyl]benzidine), and an upper layer, Alq3(tris-(8-hydroxyquinoline)aluminum). Note that, the EML 42 is also separately formed for each light-emitting region 51.

The ETL 43 is formed between the EML 42 and the upper electrode 32, and efficiently transports the electrons injected from the upper electrode 32 to the EML 42, prevents exciters from deactivated at the interface between the EML 42 and the upper electrode 32, and blocks the holes. In the embodiment, the ETL 43 is formed adjacent to the EML 42 and the upper electrode 32, and is formed common to the light-emitting regions 51.

The upper electrode 32 is a cathode to which electrons are supplied, that is, an electrode where the current flows toward the driving circuit unit, and is capable of applying a negative voltage with respect to the lower electrode 31 to the EML 42, and injects the electrons to the EML 42. The upper electrode 32 is a transparent electrode formed opposite to the lower electrode 31, and is formed on the ETL 43. Note that, the upper electrode 32 in the embodiment 1 is a common electrode formed common to the light-emitting regions 51.

Although the material and configuration of the upper electrode 32 is not particularly limited, a material and a configuration having high transmittance is preferable. With this, it is possible to implement a top-emission organic EL display apparatus having high luminous efficacy. As the material for the upper electrode 32, a transparent metal oxide such as indium tin oxide (ITO) or indium zinc oxide (IZO) may be used, for example. Furthermore, the upper electrode 32 may be a transparent electrode using materials such as Mg and Ag. The thickness of the upper electrode 32 may be 10 to 40 nm, for example.

The bank 50 is for separating and partitioning the EML 42 into light-emitting regions 51, and is formed by a black photosensitive resin such as resist, for example.

The thin-film sealing layer 61 is a protective layer formed on the upper electrode 32, protects the organic layer such as the EML 42 and the upper electrode 32 from moisture and oxygen, and prevents degradation of the EML 42. In the embodiment, the thin-film sealing layer 61 is required to be transparent. Accordingly, as the material for the thin-film sealing layer 61, a transparent insulating material such as silicon nitride (SiN), silicon oxynitride (SiON), or an organic film may be used.

The sealing resin layer 62 is a bonding layer joining a layer (organic EL layer) collectively formed from the planarizing layer 20 to the thin-film sealing layer 61 formed on the substrate 10 and the light-transmitting substrate 70, and also serves as a protective layer which protects the organic EL layer. As a material for the sealing resin layer 62, an acrylic or epoxy resin may be used, for example.

A conductive foreign material 100 is present between the lower electrode 31 and the upper electrode 32 during the fabrication process, and the lower electrode 31 and the upper electrode 32 are shorted through the foreign material 100 before the laser irradiation to be described later. Note that, the shorted part due to the foreign material 100 is an example of a defective part in the light-emitting region 51.

An altered part 32a is formed at a part of the upper electrode 32 around the foreign material 100. The altered part 32a is a part where the material composing the upper electrode 32 is altered by the irradiation with a laser beam. Stated differently, the altered part 32a can be observed as a trace of the irradiation with the laser beam. In the embodiment, the upper electrode 32 is composed of ITO. Accordingly, the altered part 32a is a part where the structure of ITO is altered to a granular structure by the irradiation with the laser beam, and the resistance at the altered part 32a is higher than the rest of the upper electrode 32.

The irradiation of the upper electrode 32 with the laser beam is performed surrounding the shorted part due to the foreign material 100. For example, the upper electrode 32 is irradiated with the laser beam tracing a contour of a square of 20 μm×20 μm defined at a periphery approximately 10 μm away from the foreign material 100 as a center. As a result, in the upper electrode 32, an altered part 32a in a square shape (frame shape) surrounding the foreign material 100 is formed as illustrated in FIG. 1(b). The resistance value of the altered part 32a is higher than the original resistance value of the upper electrode 32 not irradiated with the laser beam, and the sheet resistance value of the altered part 32a is 1 MΩ/□ or higher. Note that, in the following description, an instance where a resistance value of the part irradiated with the laser beam has a resistance value higher than the resistance value before the laser irradiation is referred to as increasing resistance.

As illustrated in FIG. 1(a) and FIG. 1(b), the organic EL device 1 includes a space 80 between the lower electrode 31 and the upper electrode 32 in a region surrounded by the altered part 32a in the upper electrode 32. The space 80 is formed with the altered part 32a by irradiating the upper electrode 32 with the laser. The space 80 is formed in the organic layer 40 near the part irradiated with the laser, that is, in the organic layer 40 around a part where the altered part 32a is formed, and may be observed as a trace of irradiation with the laser beam in the same manner as the altered part 32a. In the embodiment 1, the space 80 is formed around the altered part 32a interposing the altered part 32a, and between the EML 42 and the ETL 43 in the organic layer 40.

As described above, according to the organic EL device 1 according to the embodiment 1, the altered part 32a is formed by altering a part of the upper electrode 32 surrounding the foreign material 100 causing the short, and the space 80 is formed between the lower electrode 31 and the upper electrode 32 corresponding to the region surrounded by the altered part 32a. With this, a high resistance region due to the current barrier defined by the space 80 is formed between the lower electrode 31 and the upper electrode 32, in addition to the high resistance region by the altered part 32a. As a result, when supplying voltage to the lower electrode 31 and the upper electrode 32, more current flows in the light-emitting region 51 other than a region surrounded by the altered part 32a. Accordingly, the defect caused by the short between the lower electrode 31 and the upper electrode 32 due to the foreign material 100 can be fixed (repaired), and the light emission in the light-emitting region 51 can be recovered.

Next, the method for fabricating the organic EL device 1 according to the embodiment 1 shall be described. The fabrication method includes a process for repairing the defect caused by the short in the organic EL device 1.

Figure 2:
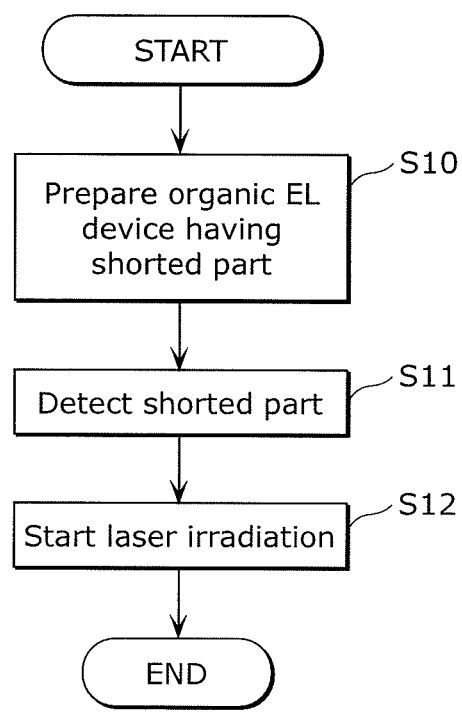
FIG. 2 is a flowchart for illustrating a method for fabricating the organic EL device according to the embodiment 1.

First, the method for fabricating the organic EL device 1 according to the embodiment 1 shall be described with reference to FIG. 2. FIG. 2 is a flowchart for describing the method for fabricating the organic EL device according to the embodiment 1.

First, the organic EL device 1 having a shorted part where the lower electrode 31 and the upper electrode 32 are shorted is prepared (S10). More specifically, an organic EL panel having an organic EL device with the shorted part is prepared. As described above, the organic EL panel includes the organic EL devices 1 arranged in a matrix for each pixel.

Next, in the prepared organic EL panel, the light-emitting region for each pixel is tested, and a shorted part where the lower electrode 31 and the upper electrode 32 are shorted in the light-emitting region is detected as a defective part (S11).

Next, the laser irradiation is started, and the defect caused by the detected shorted part is repaired by the laser irradiation (S12).

Figure 3A:
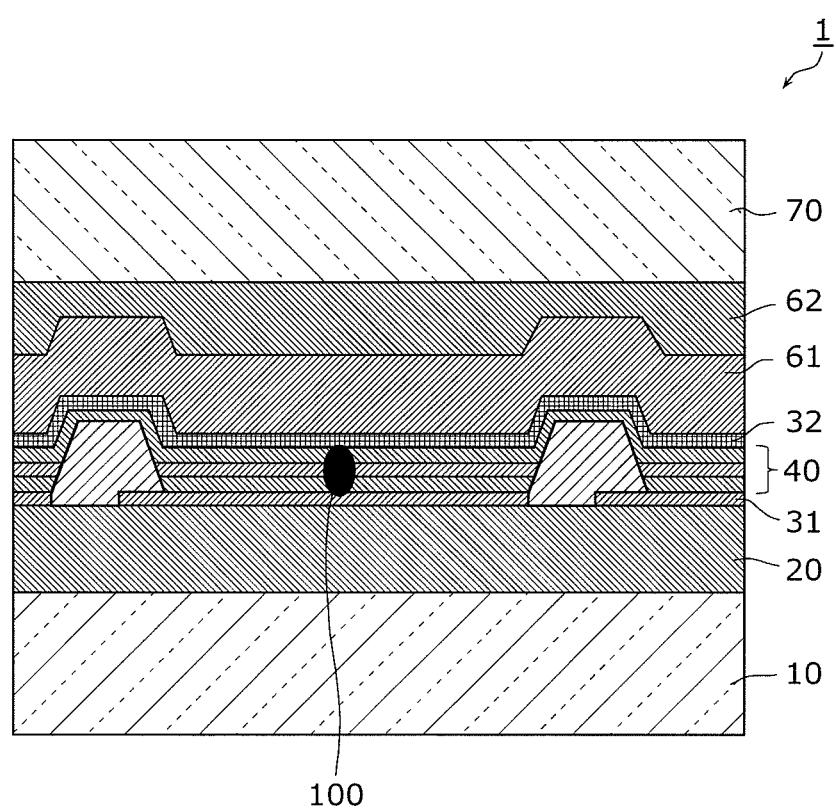
FIG. 3A is a cross-sectional view of the organic EL device prepared in a process in step S10 in the method for fabricating the organic EL device according to the embodiment 1.
Figure 3B:
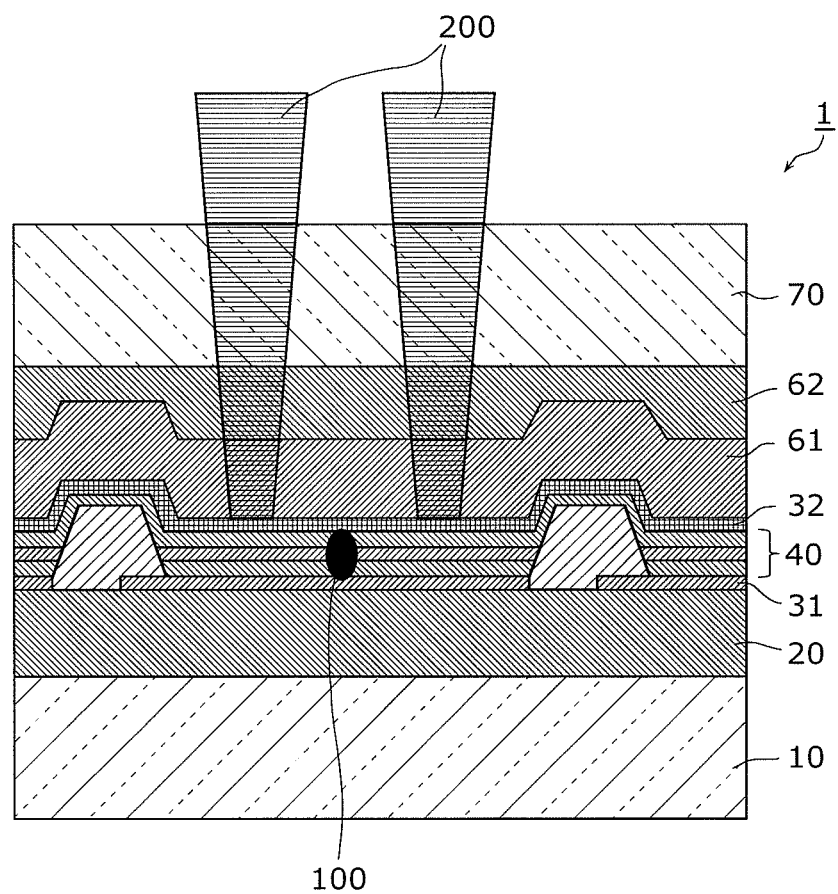
FIG. 3B is a cross-sectional view illustrating laser irradiation in a process in step S12 in the method for fabricating the organic EL device according to the embodiment 1.
Figure 3C:
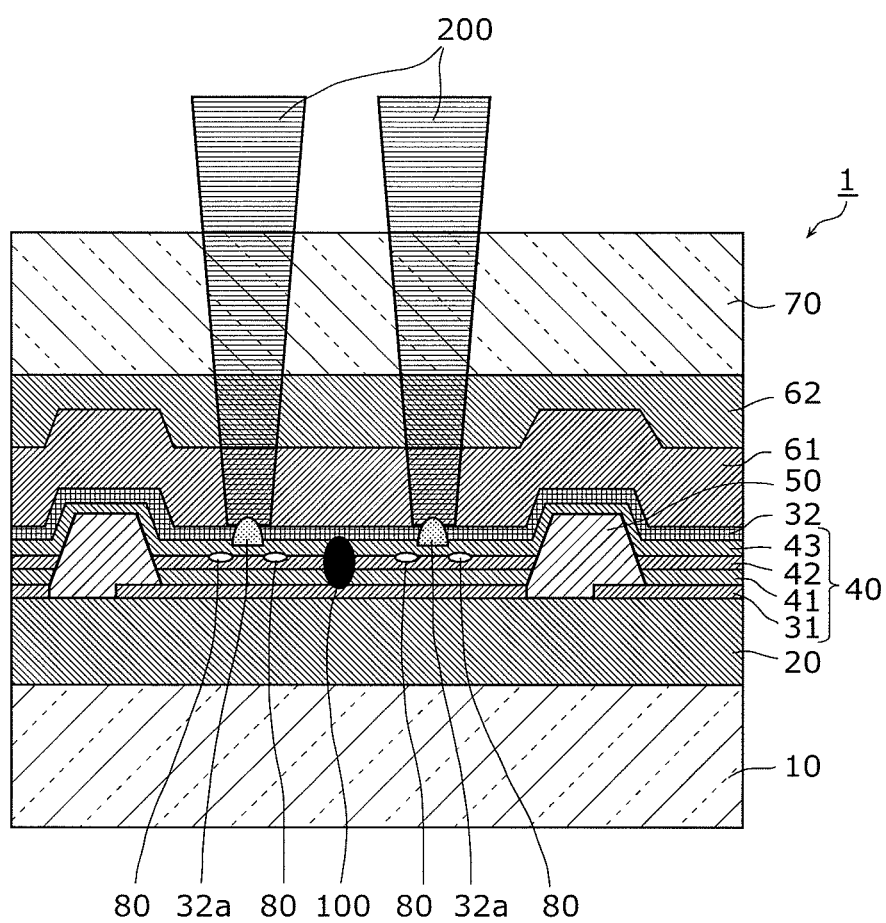
FIG. 3C is a cross-sectional view illustrating the altered part and space formed in the process in step S12 in the method for fabricating the organic EL device according to the embodiment 1.

The following shall describe the processes described above in detail referring to FIG. 3A, FIG. 3B, and FIG. 3C. FIG. 3A to FIG. 3C are cross-sectional views of the organic EL device according to the embodiment 1 in each process. FIG. 3A is a cross-sectional view of the organic EL device prepared in the process in step S10. FIG. 3B is a cross-sectional view illustrating the laser irradiation in the process in step S12. FIG. 3C is a cross-sectional view illustrating the altered part and the space formed in the process in step S12. Note that, FIG. 3A to FIG. 3C show cross-sectional structure of the organic EL device in which the lower electrode 31 and the upper electrode 32 are shorted by the foreign material 100.

First, the process for preparing the organic EL device having the shorted part (S10) shall be described with reference to FIG. 3A.

First, the planarizing layer 20 is formed by forming a planarizing film made of insulating organic material on the substrate 10, and the lower electrode 31 is formed on the planarizing layer 20. The lower electrode 31 is formed by depositing an Al film having the thickness of 30 nm on the planarizing layer 20 by sputtering, and patterning the Al film by photolithography and wet etching afterward.

Next, PEDOT is solved by the solvent made of xylene, and the PEDOT solution is coated on the lower electrode 31 by spin coating. With this, the HIL 41 is formed.

Next, α-NPD and Alq3 are stacked by the vapor deposition on the HIL 41 so as to form the EML 42, for example.

Next, the ETL 43 is formed by stacking a compound such as nitration fluorenone derivative, for example. The method for stacking the ETL 43 may be the deposition, the spin coating, the cast method, and others.

Subsequently, the upper electrode 32 is formed without exposing the substrate on which the ETL 43 is formed to the air. More specifically, the upper electrode 32 is formed by forming indium tin oxide (ITO) having the thickness of 35 nm on the ETL 43 by sputtering.

The organic EL device having the function as the light-emitting device is formed by the fabrication process described above. Note that, when fabricating the organic EL display apparatus, a process for patterning the bank 50 made of photosensitive resin into a predetermined shape is included for forming light-emitting layer 42 partitioned in a matrix, between the process for forming the lower electrode 31 and the HIL 41.

Next, on the upper electrode 32, a thin-film sealing layer 61 is formed by forming a silicon nitride having a thickness of 500 nm by plasma chemical vapor deposition (CVD), for example. The thin-film sealing layer 61 is formed in contact with the surface of the upper electrode 32. Accordingly, it is preferable that a strict condition for the protective layer is applied, and non-oxygen inorganic material represented by silicon nitride described above may be used. Furthermore, as the thin-film sealing layer 61, oxygen inorganic material such as silicon oxide and silicon oxynitride, or a stack of multiple layers of the inorganic materials may be formed. Note that, the method for forming the thin-film sealing layer 61 is not limited to the plasma CVD, and may be other methods such as sputtering using argon plasma.

Next, the sealing resin layer 62 is applied on the surface of the thin-film sealing layer 61. Subsequently, the light-transmitting substrate 70 made of transparent glass is placed on the sealing resin layer 62 applied. Here, a color filter (light-adjusting layer) may be formed on the main surface of the light-transmitting substrate 70 in advance. In this case, the light-transmitting substrate 70 is placed on the sealing resin layer 62 applied such that the surface on which the color filters are formed is opposite to the thin-film sealing layer 61. Note that, the thin-film sealing layer 61, the sealing resin layer 62, and the light-transmitting substrate 70 serve as the protective layer.

Finally, the light-transmitting substrate 70 and the thin-film sealing layer 61 are bonded by curing the sealing resin layer 62 with application of heat or energy line while pressing the light-transmitting substrate 70 downward from the side of the upper surface.

The organic EL device 1 illustrated in FIG. 3A is formed by the method described above. Note that, the process for forming the lower electrode 31, the HIL 41, the EML 42, the ETL 43, and the upper electrode 32 is not limited by the embodiment described above.

Furthermore, when a defective part, that is, a shorted part between the lower electrode 31 and the upper electrode 32 is formed due to the conductive foreign material 100 entered in the fabrication process described above in the light-emitting region 51 in the organic EL device 1, a dark spot is formed as a defect caused by the shorted part in the organic EL panel including the organic EL device 1. The foreign material 100 is Al which is a material for the lower electrode 31 attached on the lower electrode 31 after the lower electrode 31 is formed. If the organic layer 40 including the HIL 41, the EML 42, the ETL 43 and others and the upper electrode 32 are stacked with the conductive foreign material 100 attached, a shorted part is formed between the lower electrode 31 and the upper electrode 32. If the shorted part is present, the current which is supposed to drive the light emission flows focusing on the shorted part. Accordingly, the light-emitting region 51 cannot emit light sufficiently or at all. A pixel corresponding to the light emitting region 51 which lost the normal light-emission function is referred to as the dark spot pixel in the following description.

Next, the process for detecting the defective part in the organic EL device (S12) in FIG. 2 shall be described. In this process, the part shorted by the foreign material 100 or the foreign material 100 itself is detected.

Detecting the part where the lower electrode 31 and the upper electrode 32 are shorted or the foreign material 100 itself is performed by inputting luminance signal voltage corresponding to the intermediate luminance tone to each pixel and detecting luminance of light emitted by a low luminance pixel compared to luminance of light emitted by a normal pixel by a luminance measuring apparatus using a CCD camera or visual checking. Note that, the shorted part or the foreign material 100 is detected by a method other than this method, and a current value flowing between the lower electrode 31 and the upper electrode 32 in the organic EL device is measured, and the detection is performed based on the amount of the current value. In this case, a pixel in which a current value equivalent to the normal pixel is obtained when a forward bias voltage is applied, and leakage light emission is observed when a reverse bias voltage is applied may be determined as the dark spot pixel.

Next, the process for repairing the defect caused by the defective part in the organic EL device 1 by the laser irradiation (S12) shall be described. In this process, the upper electrode 32 above the shorted part in the light-emitting region 51 is irradiated with the laser beam 200 from the side of the light-transmitting substrate 70, as illustrated in FIG. 3B.

More specifically, after the foreign material 100 is detected, the lower electrode 31 is irradiated with the laser beam 200 linearly along a contour in the predetermined shape surrounding the shorted part between the lower electrode 31 and the upper electrode 32 by the foreign material 100 so as to alter the material composing the lower electrode 31. In this embodiment, the upper electrode 32 is irradiated with the laser beam 200 once along the contour of a square. Note that, the laser beam 200 is focused on the upper electrode 32.

The laser beam 200 is oscillated by a laser oscillation apparatus. For example, an ultrashort pulse laser having output energy of 1 to 30 µJ and a pulse width of a few femtoseconds to a few picoseconds may be used. A range of suitable pulse width is 100 fs to 20 ps. With this, it is possible to shorten the pulsing time of the laser for irradiating the organic layer 40. Accordingly, the resistance at the shorted part can be increased while reducing the damage on the organic layer 40. Note that, the wavelength of the laser beam 200 may be 900 to 2500 nm.

As described above, the resistance at the upper electrode 32 can be increased by altering the material composing the upper electrode 32 in an amorphous state by irradiating the upper electrode 32 with the ultrashort pulse laser. In particular, the ultrashort pulse laser can increase the resistance of the transparent conductive material which is not easily processed by other lasers.

As described above, by irradiating the laser beam 200, the structure of the upper electrode 32 in the region where the laser beam 200 is irradiated changes to the altered part 32a having the granular structure as illustrated in FIG. 3C. The granular structure here refers to a structure in which multiple particles are aggregated with void between particles. The grain size of the particles composing the granular structure is 10 to 500 nm, for example. In addition, there is void between the particles inside the altered part 32a. It is assumed that the space makes the current less likely to flow in the altered part 32a than the upper electrode 32 which is not altered, increasing the resistance. Note that, the sheet resistance value of the upper electrode 32 in the part which is not altered is $50\Omega/\square$, and the resistance value of the altered part 32a is 40 M$\Omega/\square$, for example.

Furthermore, as illustrated in FIG. 3C, the space 80 is formed around the altered part 32a by irradiating the upper electrode 32 with the laser beam 200. It is assumed that the space 80 is not formed on the part directly irradiated with the laser beam 200, but by the heat of the laser beam 200 and the oscillation of the foreign material 100. Stated differently, the two layers composing the organic layer 40 are separated by the heat of the laser beam 200, or by the oscillation of the foreign material 100 absorbed the energy of the laser beam 200. As described above, the space 80 is formed when an upper layer of the two layers composing the organic layer 40 is separated from the lower layer as if floating.

In the embodiment, the space 80 is formed between the altered part 32a directly irradiated with the laser beam 200 and between the EML 42 and the ETL 43. Stated differently, the space 80 separates the EML 42 and the ETL 43.

Figure 4:
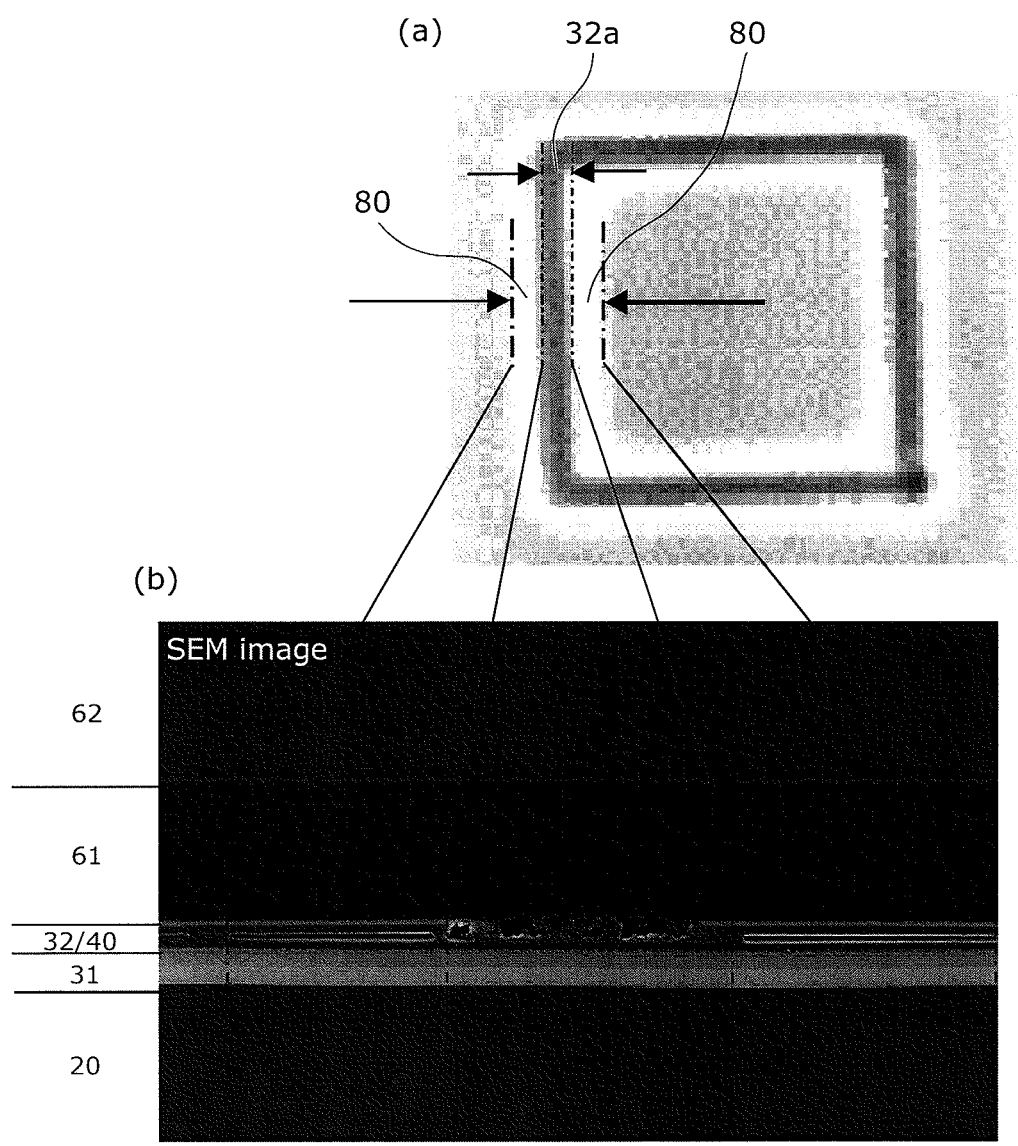
FIG. 4 is an image of the upper electrode after irradiating the organic EL device according to the embodiment 1 with the laser observed by an optical microscope or a scanning electron microscope (SEM).
Figure 5:
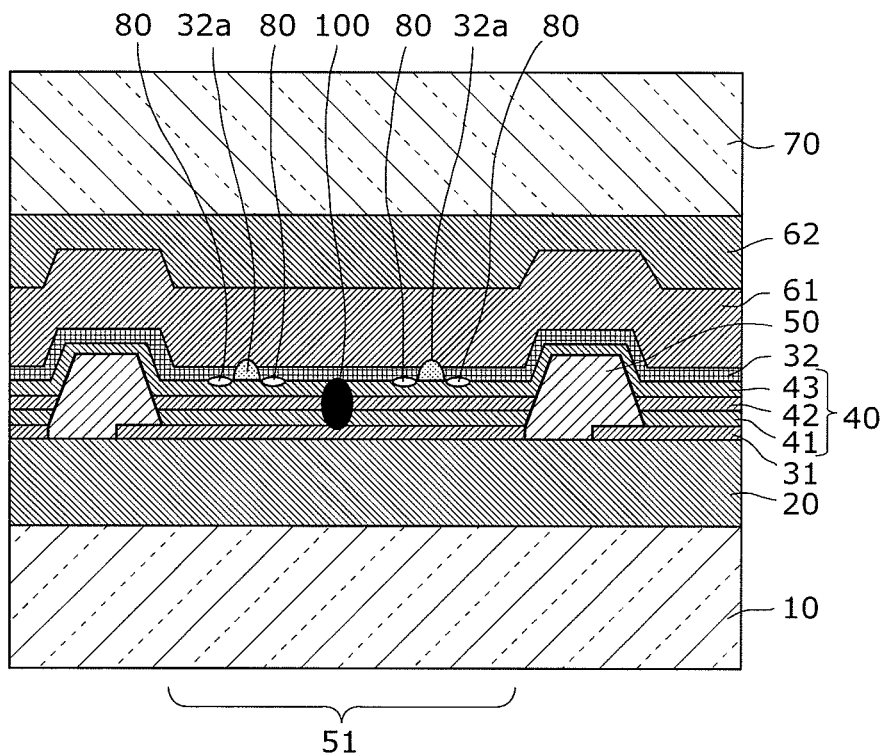
FIG. 5 is a cross-sectional view of an organic EL device according to another example of the embodiment 1.

Here, the organic EL device 1 irradiated with the laser when the lower electrode 31 and the upper electrode 32 are shorted by the foreign material 100 shall be described with reference to FIG. 4. Note that, ITO is used as the material for the upper electrode 32.

FIG. 4(a) is an image of the state of the surface of the upper electrode observed by an optical microscope after the organic EL device according to the present invention is irradiated with the laser. FIG. 4(b) is a cross-sectional SEM image after the organic EL device according to the embodiment is irradiated with the laser.

In FIG. 4(a), the part observed as a blackish frame shape is the altered part 32a, and a part observed as a whitish part around the altered part 32a is the space 80.

Furthermore, FIG. 4(b) shows that the altered part 32a in the granular structure with the structure of the upper electrode 32 altered. Furthermore, on both sides of the altered part 32a, the space 80 is formed as if separating the EML 42 and the ETL 43.

As described above, according to the method for fabricating the organic EL device 1 according to the embodiment 1, the altered part 32a is formed by altering a part of the upper electrode 32 and the space 80 is formed in the organic layer 40 around the altered part 32a by irradiating the upper electrode 32 with the laser beam. As a result, a high resistance region can be formed in the upper electrode 32 and the organic layer 40. Accordingly, when supplying voltage to the lower electrode 31 and the upper electrode 32, more current flows in the light-emitting region 51 other than a region surrounded by the altered part 32a. Accordingly, the defect caused by the short between the lower electrode 31 and the upper electrode 32 due to the foreign material 100 can be fixed (repaired), and the light emission in the light-emitting region 51 can be recovered.

Note that, although the upper electrode 32 is irradiated with the laser beam 200 in the embodiment, the lower electrode 31 may be irradiated with the laser beam 200. More specifically, when the lower electrode 31 is made of a transparent conductive material, the lower electrode 31 is irradiated with the laser by adjusting the focus of the laser beam. With this, the same operation and effect as the description above can be achieved. In this case, the laser irradiation may be performed from the side of the light-transmitting substrate 70 but from the side of the substrate 10 made of transparent glass.

Furthermore, in the embodiment, the space 80 is formed between the EML 42 and the ETL 43. However, the space 80 is formed between the upper electrode 32 and the ETL 43, and the upper electrode 32 may be separated from the ETL 43 as if floating. Even in this case, the effect identical to the effect described above can be achieved.

Embodiment 2

Figure 6:
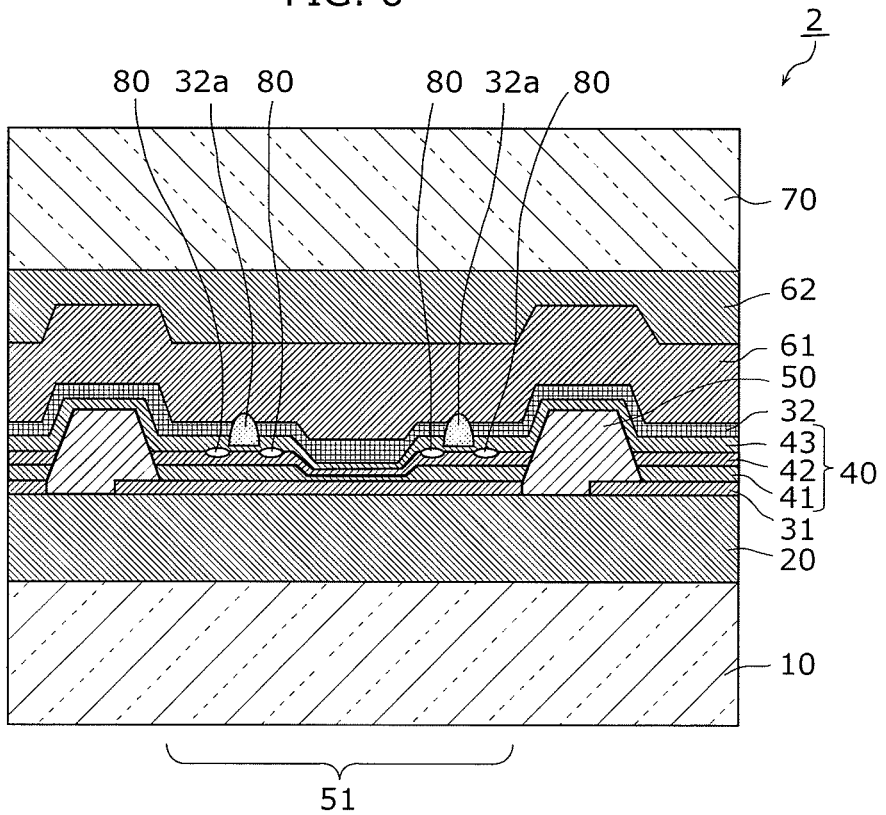
FIG. 6 is a cross-sectional view of an organic EL device according to the embodiment 2.
Figure 7:
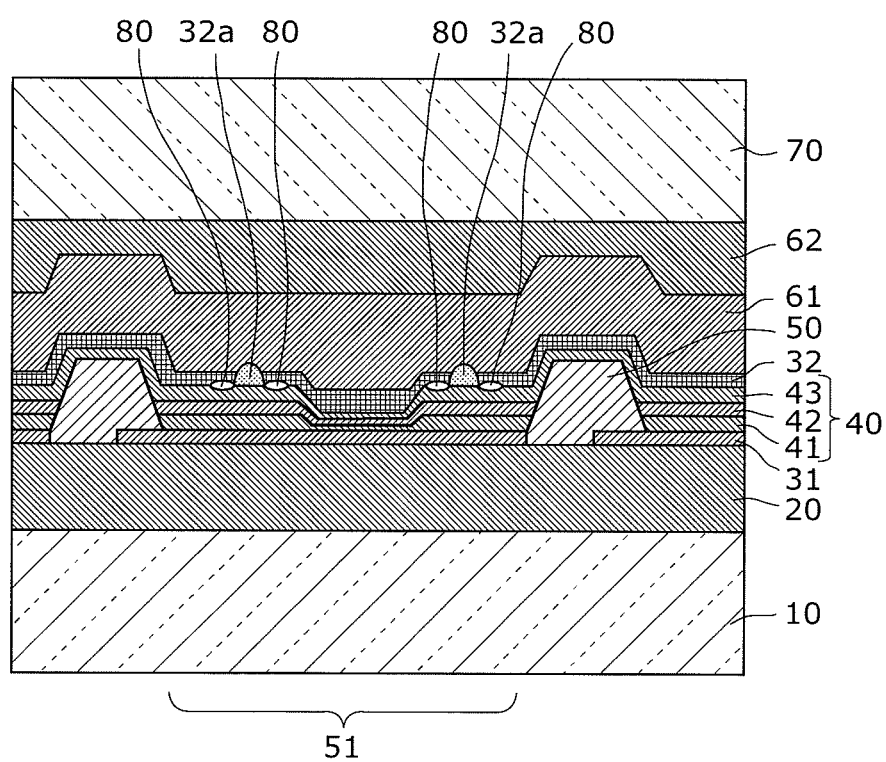
FIG. 7 is a cross-sectional view of an organic EL device according to another example of the embodiment 2.

First, an organic EL device 2 according to the embodiment 2 shall be described with reference to FIG. 6. FIG. 6 is a cross-sectional view of an organic EL device according to the embodiment 2. Note that, in FIG. 6, the same reference numerals are assigned to the components identical to the components in FIG. 1, and the detailed description shall be omitted or simplified.

The organic EL device 2 according to the embodiment 2 is different from the organic EL device 1 according to the embodiment 1 in that the lower electrode 31 and the upper electrode 32 are shorted without interposing a conductive foreign material in between before the repair (laser irradiation).

As illustrated in FIG. 6, the organic EL device 2 according to the embodiment has a thin-film part in which a part of layers composing the organic layer 40 is unexpectedly thin. As a result, the resistance between the lower electrode 31 and the upper electrode 32 in the thin-film part is extremely low compared to the resistance in the other part, which makes the current likely to flow in the thin-film part, resulting in a short.

In the embodiment 2, the altered part 32a may be formed at a part of the upper electrode 32 surrounding the thin-film part, and the space 80 is formed around the altered part 32a. Note that, as illustrated in FIG. 6, the space 80 is formed between the EML 42 and the ETL 43, and the space 80 is created as if the ETL 43 is floating above the EML 42. In addition, the altered part 32a and the space 80 are formed by irradiating the upper electrode 32 with the laser beam, in the same method as the embodiment 1.

As described above, according to the organic EL device 2 according to the embodiment, the altered part 32a is formed by altering a part of the upper electrode 32 surrounding the thin-film part causing the short-circuit defect, and the space 80 is formed in the organic layer 40. With this, a high resistance region having the altered part 32a and the space 80 is formed in the same manner as the embodiment 1. Accordingly, the short-circuit defect between the lower electrode 31 and the upper electrode 32 due to the thin-film part can be fixed (repaired), recovering the light emission in the light-emitting region 51.

Note that, the method for fabricating the organic EL device 2 according to the embodiment may be performed in the same manner as the embodiment 1. Furthermore, in the embodiment 2, color filters for adjusting colors in red, green, and blue may be included. In addition, the lower electrode 31 may be irradiated with the laser in the embodiment 2 as well.

Furthermore, in the embodiment 2, the space 80 is formed between the EML 42 and the ETL 43. However, the space 80 is formed between the upper electrode 32 and the ETL 43, and the upper electrode 32 may be separated from the ETL 43 as if floating. Even in this case, the effect identical to the effect described above can be achieved.

Furthermore, in the embodiment 2, an example in which the lower electrode 31 and the upper electrode 32 are shorted by the thin-film part formed in the organic layer 40 is illustrated. However, the embodiment 2 may be applied to a case where the lower electrode 31 and the upper electrode 32 directly in contact with each other due to a defect such as a pin hole in the organic layer 40, causing a short.

Embodiment 3

Figure 8:
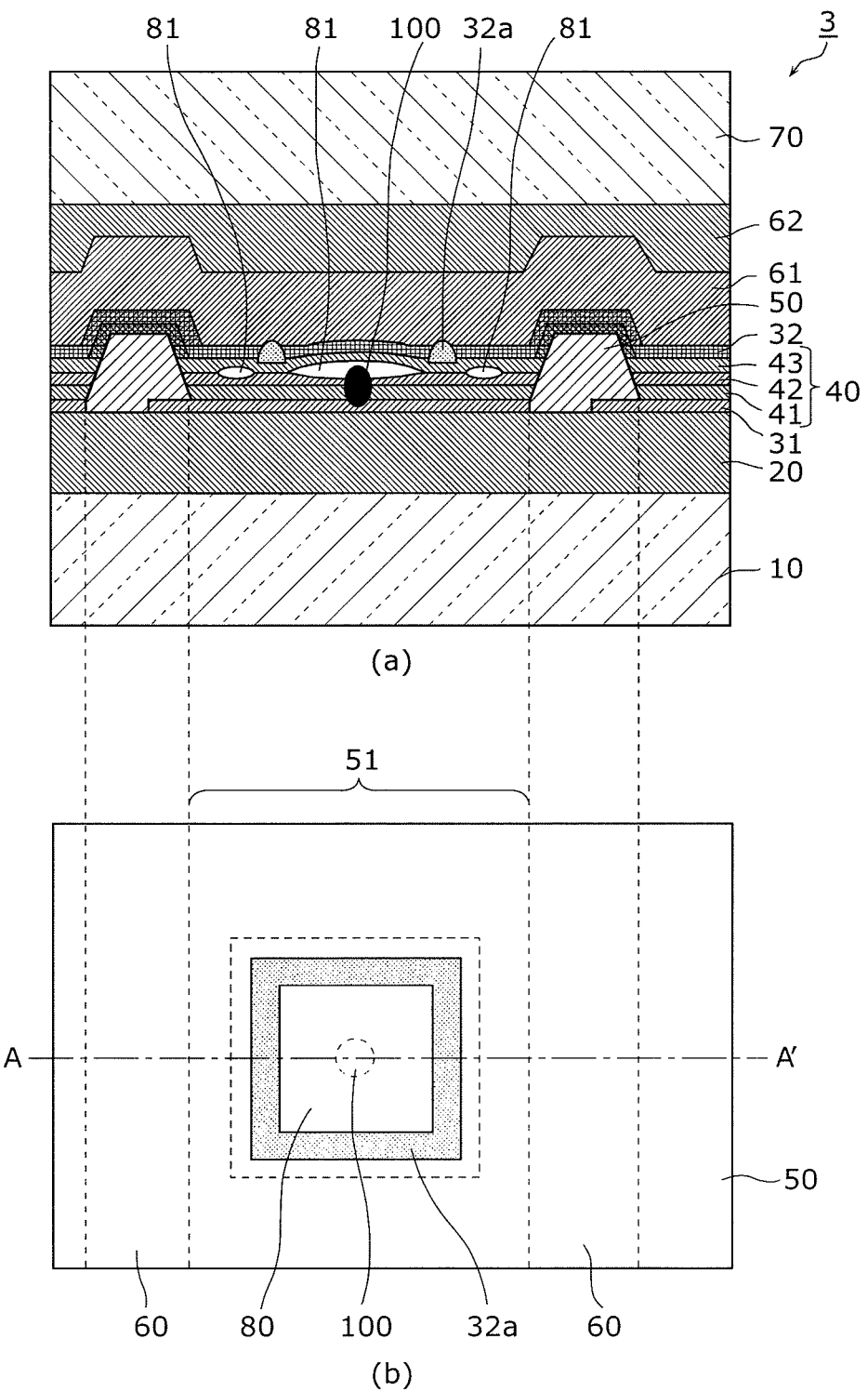
FIG. 8 is a cross-sectional view and a plan view of an organic EL device according to another example of the embodiment 3.

First, an organic EL device 3 according to the embodiment 3 shall be described with reference to FIG. 8. FIG. 8 is a cross-sectional view of an organic EL device according to the embodiment 3. FIG. 8 illustrates a configuration of one pixel when the organic EL device according to the embodiment 3 is applied to an organic EL display apparatus, and FIG. 8(a) is a cross-sectional view of an organic EL device according to the embodiment 3. FIG. 8(b) is a plan view of the organic EL device. Note that, FIG. 8(a) is a cross-sectional view along the line A-A' in FIG. 8(b). Note that, in FIG. 8, the same reference numerals are assigned to the components identical to the components in FIG. 1, and the detailed description shall be omitted or simplified.

The organic EL device 3 according to the embodiment 3 is the same as the organic EL device 1 according to the embodiment 1 in that the lower electrode 31 and the upper electrode 32 are shorted through the conductive material 100, but is different from the organic EL device 1 according to the embodiment 1 in that the space 81 formed on the organic layer 40 is formed in the entire region surrounded by the altered part 32a.

As illustrated in FIG. 8(a) and FIG. 8(b), the altered part 32a is formed in a part of the upper electrode 32 so as to surround the conductive foreign material 100 in the embodiment 3, in the same manner as the embodiment 1.

Furthermore, in the embodiment 3, the space 81 is formed around the altered part 32a, interposing the altered part 32a. However, the space 81 in a region surrounded by the altered part 32a is formed in the entire region surrounded by the altered part 32a. Stated differently, the space 81 is in a state where the space 80 in a region surrounded by the altered part 32a in the embodiment 1 expands, and the space 80 is connected in the entire region.

In addition, the space 81 in according to the embodiment 3 is formed between the EML 42 and the ETL 43, and between the conductive foreign material 100 and the ETL 43 as illustrated in FIG. 8(a). Stated differently, the ETL 43 and the EML 42 are significantly spaced apart, and the distance of the isolation between the electron transport layer 43 and the EML 42 in the stacking direction is large. Consequently, the foreign material 100 is not contacting the ETL 43.

Note that, the altered part 32a and the space 81 can be formed by irradiating the upper electrode 32 with the laser beam.

Figure 9A:
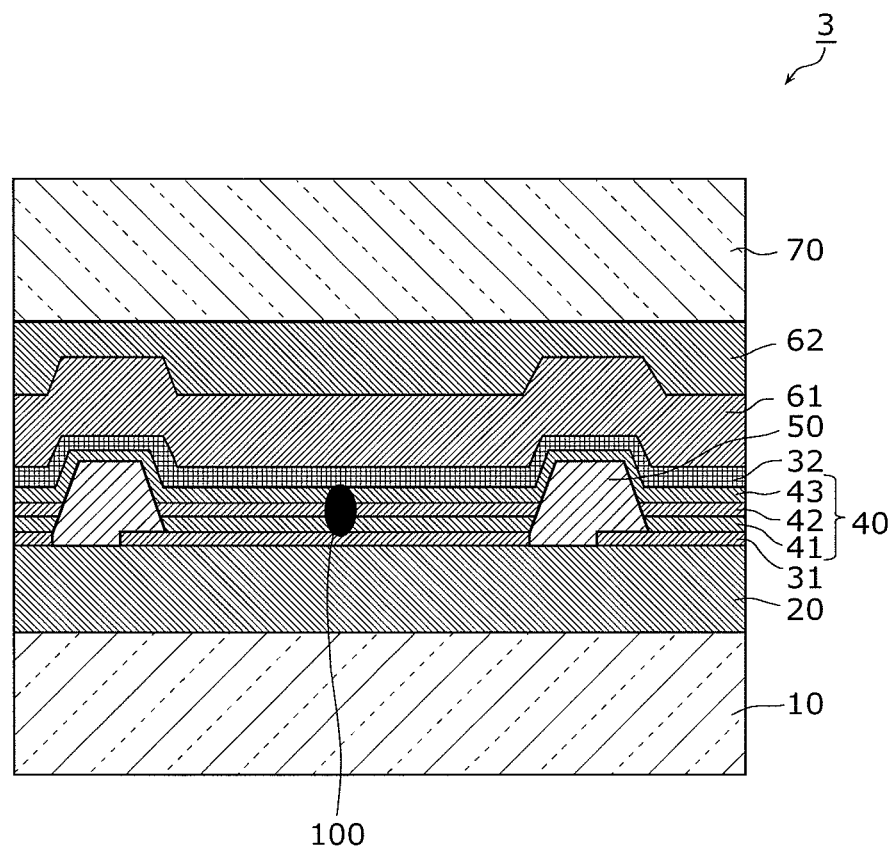
FIG. 9A is a cross-sectional view of the organic EL device prepared in a process in step S10 in the method for fabricating the organic EL device according to the embodiment 3.
Figure 9B:
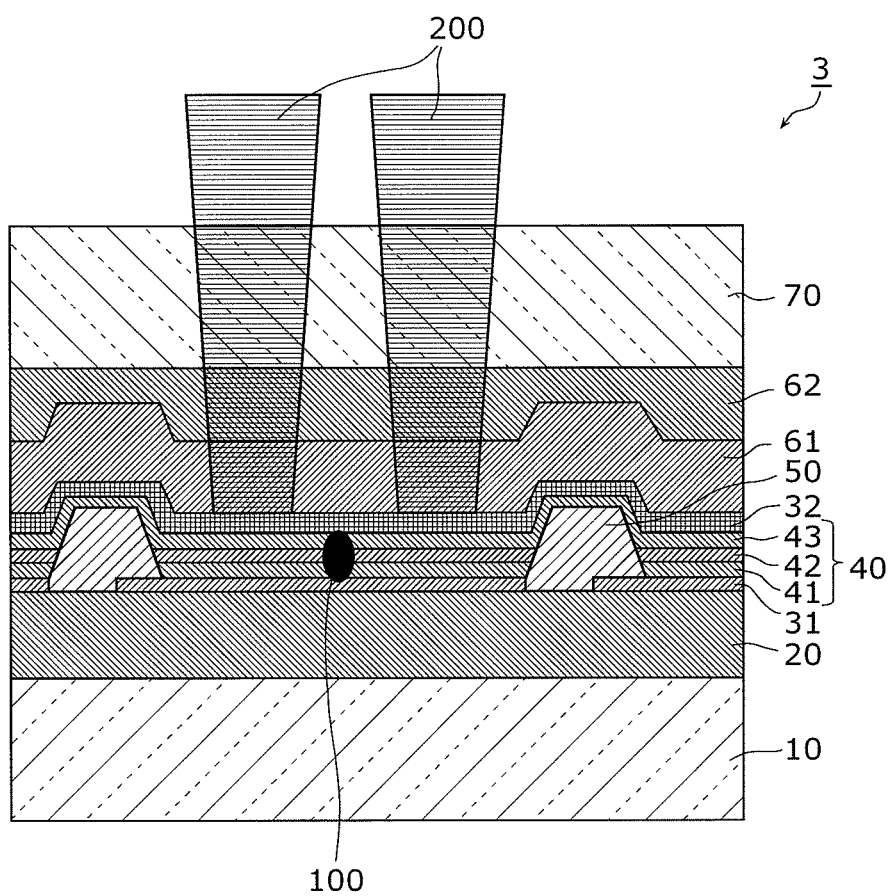
FIG. 9B is a cross-sectional view illustrating laser irradiation in a process in step S12 in the method for fabricating the organic EL device according to the embodiment 3.
Figure 9C:
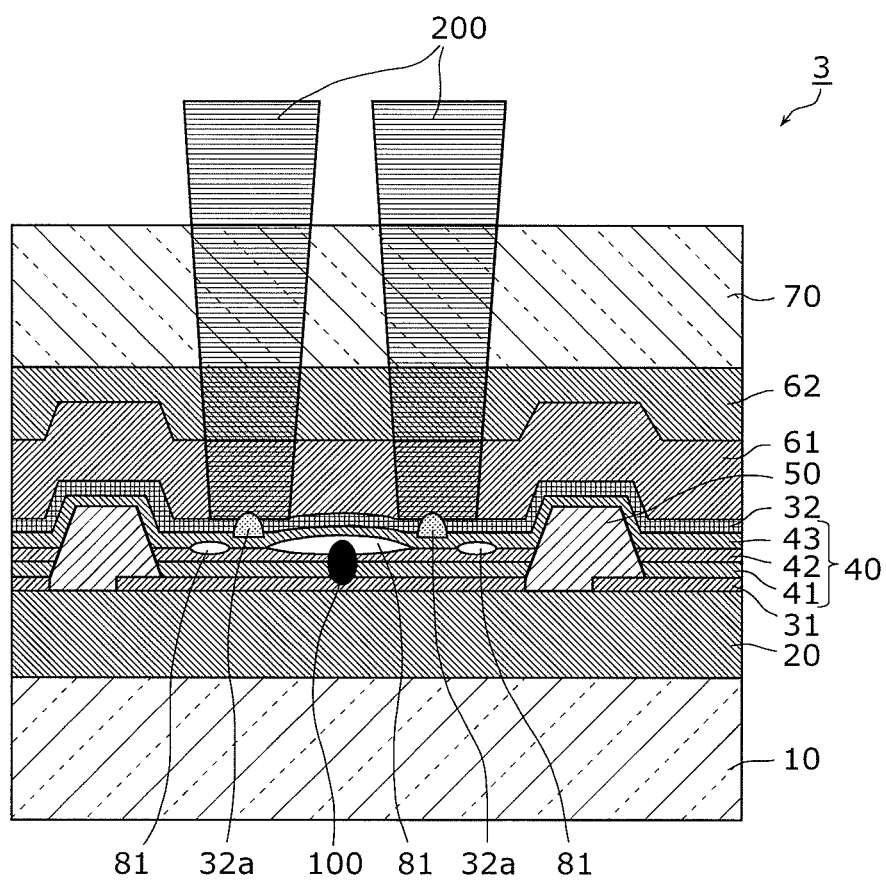
FIG. 9C is a cross-sectional view illustrating the altered part and space formed in the process in step S12 in the method for fabricating the organic EL device according to the embodiment 3.

Next, the method for fabricating the organic EL device 3 according to the embodiment 3 shall be described with reference to FIG. 9A, FIG. 9B, and FIG. 9C. FIG. 9A to FIG. 9C are cross-sectional views of the processes in the method for fabricating the organic EL device according to the embodiment 3, and correspond to FIG. 3A to FIG. 3C, respectively.

The fabrication method according to the embodiment 3 is identical to the fabrication method according to the embodiment 1. First, the organic EL device 3 having a shorted part caused by the foreign material 100 is prepared. In this process, the organic EL device 3 having the short-circuit defect causing a dark spot pixel is prepared, in the same manner as the process described with reference to FIG. 3A.

Next, in the same manner as the method according to the embodiment 1, the defective part in the organic EL device 3, that is, a part shorted by the foreign material 100 is detected.

Next, by the same method as the embodiment 1, the defect caused by the defective part of the organic EL device 3 is repaired by the laser irradiation. Stated differently, the focus of the laser beam 200 is set on the upper electrode 32, and the upper electrode 32 at a part above the shorted part in the pixel is irradiated with the laser beam from the side of the light-transmitting substrate 70 as illustrated in FIG. 9B. The same type of laser as the embodiment 1 may be used. The region of the upper electrode 32 irradiated with the laser beam changes to the altered part 32a having a granular structure, as illustrated in FIG. 9C. Here, by the emission of the laser beam 200, the space 81 is formed in the entire region surrounded by the altered part 32a. The space 81 is formed as in the embodiment 1, and is formed by the heat of the laser beam 200 and the oscillation of the foreign material 100. In this case, the two layers composing the organic layer 40 are likely to be separated when the energy of the heat by the laser beam 200 and the energy of the oscillation of the foreign material 100. With this, the space 81 is formed in the entire region surrounded by the altered part 32a.

Figure 10:
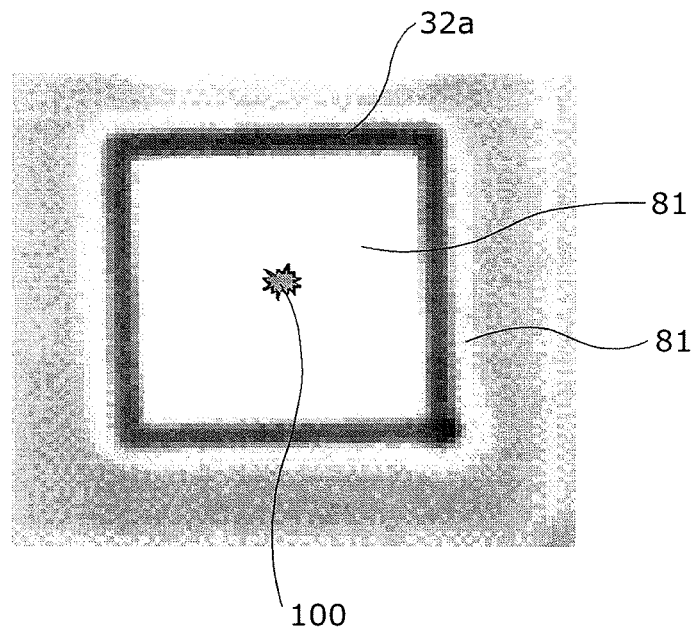
FIG. 10 is an image of a state of surface of the upper electrode observed by the optical microscope after the organic EL device according to the embodiment 3 is irradiated with the laser.

FIG. 10 is an image of a state of surface of the upper electrode observed by the optical microscope after the organic EL device according to the embodiment 3 is irradiated with the laser.

In FIG. 10, the part observed as a blackish frame shape is the altered part 32a, and a part observed as a whitish part in a region surrounded by the altered part 32a and a part observed as a whitish part around the altered part 32a are the space 81.

As described above, according to the organic EL device 3 according to the embodiment 3, the altered part 32a is formed surrounding the foreign material 100 causing the short-circuit defect, and the space 81 is formed in the entire region surrounded by the altered part 32a in the organic layer 40. As described above, the space 81 according to the embodiment 3 has a larger space than the space 80 according to the embodiment 1. Accordingly, the resistance value can be increased further, and the short-circuit defect can be solved more securely compared to the embodiment 1.

Furthermore, according to the embodiment 3, the conductive foreign material 100 is not contacting the ETL 43 due to the space 81. Accordingly, it is possible to block the current path by the foreign material 100. With this, the short-circuit defect can be completely solved.

In particular, in the embodiment 3, the space 81 having a resistance value near infinity is formed by the separation of the foreign material 100 and the upper electrode 32, in addition to the altered part 32a having a finite resistance value. Accordingly, EL current for the repaired pixel is secured even if a resistance value of the organic layer 40 increases when displaying a low tone, or a resistance value increases along with the chronological change in the organic layer 40. With this, sufficient luminance for the repaired pixel is secured, and a high quality display can be achieved even after the repair.

Furthermore, the space 81 is formed near the altered part 32a, that is, near the part irradiated with the laser. Accordingly, the space 81 can be formed in an entire region surrounded by the altered part 32a by reducing the region irradiated with the laser beam. With this, it is possible to reduce the repaired region surrounded by the altered part 32a. Accordingly, it is less likely that the trace of repair is visually recognized on the display, allowing a high quality display after the repair. Furthermore, by reducing the repaired region, the product life of the organic layer 40 in the repaired pixel can be increased.

Furthermore, in the embodiment 3, color filters for adjusting colors in red, green, and blue may be included. In addition, the lower electrode 31 may be irradiated with the laser in the embodiment 2 as well.

Figure 11:
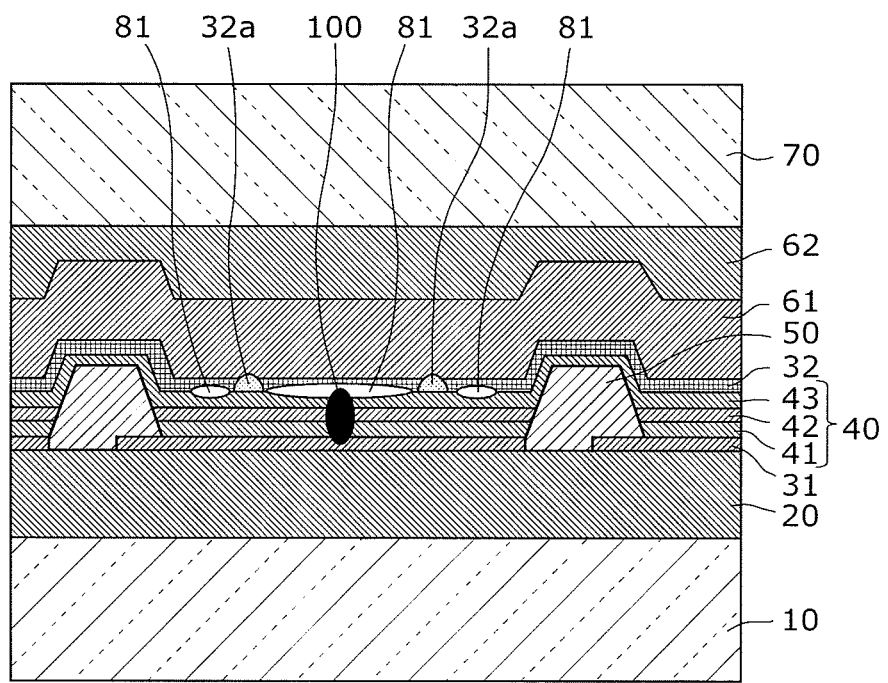
FIG. 11 is a cross-sectional view of an organic EL device according to another example of the embodiment 3.

Furthermore, in the embodiment 3, the space 81 is formed between the EML 42 and the ETL 43. However, the space 81 is formed between the upper electrode 32 and the ETL 43, and the upper electrode 32 may be separated from the ETL 43 as if floating, as illustrated in FIG. 11. In this case, the foreign material 100 is in a completely contactless state with the upper electrode 32 due to the space 81. Accordingly, the current path by the foreign material 100 is blocked, completely solving the short-circuit defect. Furthermore, sufficient luminance can be secured even if the resistance value of the organic layer 40 in the repaired pixel is increased due to the space 81 which has a resistance value close to infinity. Furthermore, the repaired region surrounded by the altered part 32a can be reduced. Accordingly, it is possible to make the trace of repair less noticeable, and increase the product life of the organic layer 40 in the repaired pixel.

Embodiment 4

Figure 12:
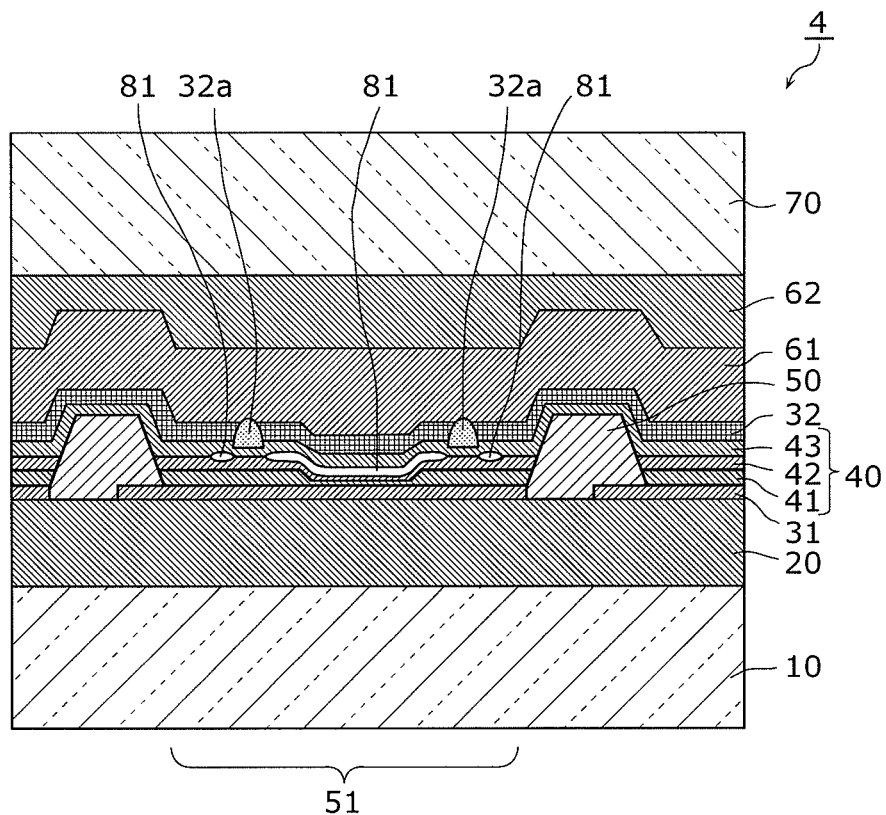
FIG. 12 is a cross-sectional view of an organic EL device according to another example of the embodiment 4.

Next, an organic EL device 4 according to the embodiment 4 shall be described with reference to FIG. 12. FIG. 12 is a cross-sectional view of an organic EL device according to the embodiment 4. Note that, in FIG. 12, the same reference numerals are assigned to the components identical to the components in FIG. 1, and the detailed description shall be omitted or simplified.

In the organic EL device 4 according to the embodiment 4, the lower electrode 31 and the upper electrode 32 are shorted without interposing a conductive foreign material in between before the repair (laser irradiation), in the same manner as the embodiment 2. Stated differently, there is a short due to the unexpected thin-film part in a part of the layer composing the organic layer 40 in the organic EL device 4 according to the embodiment 4.

In the embodiment 4, the altered part 32a is formed in a part of the upper electrode 32 surrounding the thin-film part, and the space 81 is formed in the entire region surrounded by the altered part 32a in the organic layer 40, in the same manner as the embodiment 3. Note that, as illustrated in FIG. 12, the space 81 is formed between the EML 42 and the ETL 43. In addition, the altered part 32a and the space 81 are formed by irradiating the upper electrode 32 with the laser beam, in the same method as the embodiment 3.

As described above, according to the organic EL device 4 according to the embodiment 4, the altered part 32a is formed by altering a part of the upper electrode 32 surrounding the thin-film part causing the short-circuit defect, and the space 81 is formed in the entire region surrounded by the altered part 32a in the organic layer 40. Furthermore, according to the embodiment 3, the conductive foreign material 100 is not contacting the ETL 43 due to the space 81. Accordingly, it is possible to block the current path by the foreign material 100. With this, the short-circuit defect can be completely solved.

Furthermore, in the same manner as the embodiment 3, the space 81 having a resistance value close to the infinity is formed in addition to the altered part 32a having a finite resistance value. Accordingly, the EL current in the repaired pixel is secured even if the resistance value increases, securing sufficient luminance in the repaired pixel.

Furthermore, the space 81 is formed near the altered part 32a, that is, near the part irradiated with the laser. Accordingly, the space 81 can be formed in an entire region surrounded by the altered part 32a by reducing the region irradiated with the laser beam. Furthermore, the repaired region surrounded by the altered part 32a can be reduced. Accordingly, it is possible to make the trace of repair less noticeable, and increase the product life of the organic layer 40 in the repaired pixel.

Note that, the method for fabricating the organic EL device 4 according to the embodiment may be performed in the same manner as the embodiment 1. Furthermore, in the embodiment, color filters for adjusting colors in red, green, and blue may be included. In addition, the lower electrode 31 may be irradiated with the laser in the embodiment 2 as well.

Figure 13:
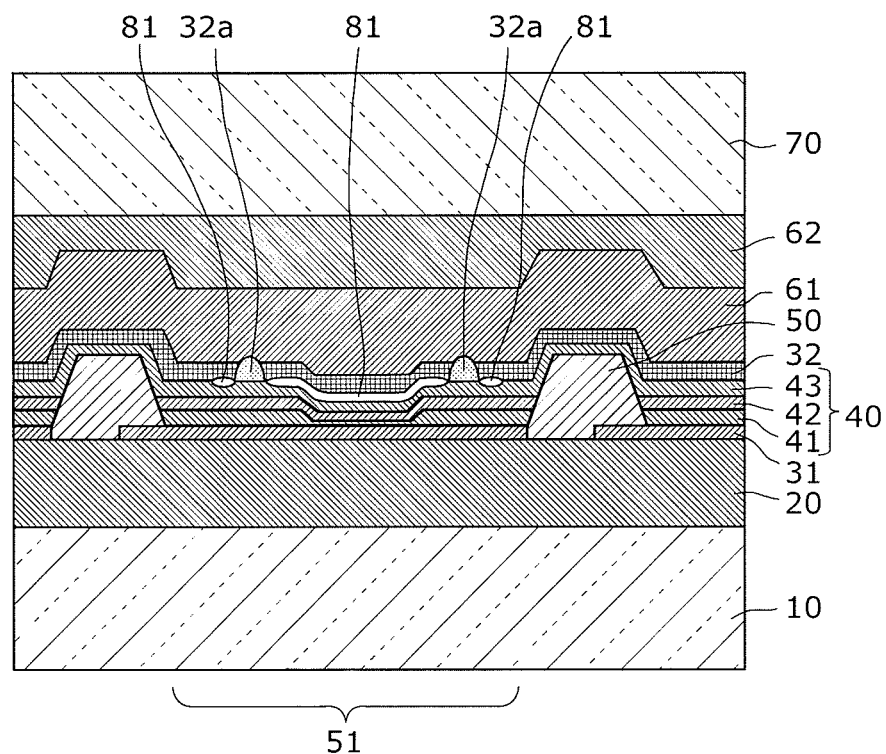
FIG. 13 is a cross-sectional view of an organic EL device according to another example of the embodiment 4.

Furthermore, in the embodiment 4, the space 81 is formed between the EML 42 and the ETL 43. However, the space 81 is formed between the upper electrode 32 and the ETL 43, as illustrated in FIG. 13. Even in this case, the effect identical to the effect described above can be achieved.

The method for fabricating the organic EL device and the organic EL device according to the present invention are described as in the embodiments. However, the present invention is not limited to the embodiments.

For example, in the embodiment 4, the organic EL device may include color filters which are light-adjusting layers for adjusting the colors in red, green, and blue above the thin-film sealing layer 61 and the sealing resin layer 62 so as to cover the light-emitting regions 51 isolated by the bank 50. In this case, the laser irradiation for repair is performed through the color filters and the protective layer. Note that, the color filters may be formed at a surface below the light-transmitting substrate 70 (a surface facing the organic layer 40).

Furthermore, in the embodiments above, the configuration in which the lower electrode 31 is the anode and the upper electrode 32 is the cathode is described. However, the lower electrode 31 may be the cathode, and the upper electrode 32 may be the anode.

Those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The method for fabricating the organic EL device and the organic EL device according to the present invention are widely applicable to a flat-panel display such as an organic EL display apparatus, a display apparatus such as a television set, a personal computer, or a mobile phone, particularly to a display apparatus which requires a large screen and a high definition.

REFERENCE SIGNS LIST 1, 2, 3, 4 Organic EL device
10 Substrate
20 Planarizing layer
31 Lower electrode
32 Upper electrode
32a Altered part
40 Organic layer
41 Hole injection layer (HIL)
42 Emitting layer (EML)
43 Electron transport layer (ETL)
50 Bank
51 Light-emitting region
61 Thin-film sealing layer
62 Sealing resin layer
70 Light-transmitting substrate
80, 81 Space
100 Foreign material
200 Laser beam

The invention claimed is:

1. A method for fabricating an organic electroluminescence device comprising:
preparing an organic electroluminescence device having a lower electrode, an organic layer including an emitting layer, an upper electrode, and a shorted part in which the lower electrode and the upper electrode are shorted; and
irradiating a part surrounding the shorted part with an ultrashort pulse laser, the ultrashort pulse irradiation altering a material composing the lower electrode or the upper electrode such that an altered part is formed, and forming a hollow space, which is different from the altered part, between the lower electrode and the upper electrode in a region surrounded by the altered part in a plan view,
wherein, when irradiating the part surrounding the shorted part with the ultrashort pulse laser, the shorted part is not irradiated, and
a pulse width of the ultrashort pulse laser is 100 fs to 20 ps.

2. The method for fabricating the organic electroluminescence device according to claim 1,
wherein, when preparing the organic electroluminescence device, a material composing at least one of the lower electrode and the upper electrode in the organic electroluminescence device is prepared with a transparent metal oxide.

3. The method for fabricating the organic electroluminescence device according to claim 2,
wherein, when irradiating the part surrounding the shorted part with the ultrashort pulse laser, the transparent metal oxide is altered to have a granular structure and a higher resistance value such that the altered part is formed.

4. The method for fabricating the organic electroluminescence device according to claim 1,
wherein, when preparing the organic electroluminescence device, the organic electroluminescence device including the organic layer having an electron transport layer adjacent to the emitting layer is prepared, and
when irradiating the part surrounding the shorted part with the laser, the hollow space is formed between the emitting layer and the electron transport layer.

5. The method for fabricating the organic electroluminescence device according to claim 1,
wherein, when preparing the organic electroluminescence device, an organic electroluminescence device including the organic layer having an electron transport layer adjacent to the upper electrode is prepared, and
when irradiating the part surrounding the shorted part with the laser, the hollow space is formed between the upper electrode and the electron transport layer.

6. The method for fabricating the organic electroluminescence device according to claim 1,
wherein, when preparing the organic electroluminescence device, an electroluminescence device including a conductive foreign material in the organic layer at the shorted part is prepared.

7. The method for fabricating the organic electroluminescence device according to claim 6, wherein, when irradiating the part surrounding the shorted part with the laser, the hollow space is formed between the conductive foreign material and the upper electrode.

8. The method for fabricating the organic electroluminescence device according to claim 1,
wherein a wavelength of the ultrashort pulse laser is 900 to 2500 nm.

9. The method for fabricating the organic electroluminescence device according to claim 1,
wherein, when preparing the organic electroluminescence device, an organic electroluminescence device in which a protective layer is formed above the upper electrode is prepared, and
when irradiating the part surrounding the shorted part with the ultrashort pulse laser, the ultrashort pulse laser irradiation is performed through the protective layer.

10. The method for fabricating the organic electroluminescence device according to claim 9,
wherein, when preparing the organic electroluminescence device, an organic electroluminescence device having a light-adjusting layer formed above the protective layer is prepared, and
when irradiating the part surrounding the shorted part with the ultrashort pulse laser, the ultrashort pulse laser irradiation is performed through the protective layer and the light-adjusting layer.

11. An organic electroluminescence device comprising:
a lower electrode;
an organic layer including an emitting layer;
an upper electrode;
a shorted part in which the lower electrode and the upper electrode are shorted;
an altered part in a transparent metal oxide composing the lower electrode or the upper electrode on an area surrounding the shorted part in a plan view; and
a hollow space provided in the organic layer between the lower electrode and the upper electrode in a region surrounded by the altered part in a plan view,
wherein, the altered part has a granular structure, and an electrical resistance value of the altered part is higher than an electrical resistance of the transparent metal oxide composing the lower electrode or the upper electrode.

12. The organic electroluminescence device according to claim 11,
wherein a sheet resistance value of the altered part is at least 1 MΩ/□.

13. The organic electroluminescence device according to claim 11,
wherein the organic layer includes an electron transport layer adjacent to the emitting layer, and
the hollow space is provided between the emitting layer and the electron transport layer.

14. The organic electroluminescence device according to claim 11,
wherein the organic layer includes an electron transport layer adjacent to the upper electrode, and
the hollow space is provided between the upper electrode and the electron transport layer.

15. The organic electroluminescence device according to claim 11,
wherein a conductive foreign material is included in the organic layer in a region surrounded by the altered part.

16. The organic electroluminescence device according to claim 15,
wherein the hollow space is provided between the conductive foreign material and the upper electrode.

17. The organic electroluminescence device according to claim 11, wherein the altered part has a ring shape such that the hollow space is positioned in the ring shape in the plan view.

18. The method for fabricating the organic electroluminescence device according to claim 1, wherein the shorted part remains after the part surrounding the shorted part is irradiated with the ultrashort pulse laser.

* * * * *